United States Patent [19]

Grassl

[11] 4,250,568
[45] Feb. 10, 1981

[54] CAPACITOR SEMICONDUCTOR STORAGE CIRCUIT

[75] Inventor: Gerhard Grassl, Munich, Fed. Rep. of Germany

[73] Assignee: Siemens Aktiengesellschaft, Berlin & Munich, Fed. Rep. of Germany

[21] Appl. No.: 98,123

[22] Filed: Nov. 28, 1979

[30] Foreign Application Priority Data

Dec. 20, 1978 [DE] Fed. Rep. of Germany ....... 2855079

[51] Int. Cl.³ ............................................ G11C 11/24
[52] U.S. Cl. .................................................. 365/149
[58] Field of Search ......................................... 365/149

[56] References Cited

PUBLICATIONS

R. Koch et al., "Three-Terminal CID as Random Access Memory Cell," IEEE Jour. of Solid-State Circuits, vol. SC-12, No. 5, 10/77, pp. 534–536.
J. I. Raffel et al., "Storage Experiments with Ultra-High Density MNOS Capacitors," IEEE Proceedings, vol. 64, p. 11, 11/76.
Geipel et al., "Self-Aligned Fine Line Process for Making Capacitor Memories," IBM Tech. Disc. Bul., vol. 20, No. 7, 12/77, pp. 2588–2589.

*Primary Examiner*—Stuart N. Hecker
*Attorney, Agent, or Firm*—Hill, Van Santen; Steadman, Chiara & Simpson

[57] ABSTRACT

A semiconductor storage circuit has a plurality of storage elements which are provided with storage capacitors and which are grouped in rows and columns and integrated on a doped semiconductor body. The storage elements which form a row are provided with a common first drive line and the storage elements which form a column are provided with a second common drive line. The first drive lines are formed from strip-like electrically conductive layers which are separated by an insulating layer from the surface of the semiconductor body and the second drive lines consist of buried lines which extend within the semiconductor body and are oppositely doped with respect to the body. The insulating layer is designed to be thinner within the intersection zones of the drive lines so that in these zones insulating layer capacitors are formed which possess outer electrodes composed of parts of the first drive lines and which represent storage capacitors of the storage elements. The widths of the buried lines which represent the second drive lines are designed to be less than the dimensions, oriented transversely to these strips, of the outer electrodes, and between the buried lines which represent the second drive lines further buried lines are arranged which can be connected by way of terminals to a voltage source.

4 Claims, 3 Drawing Figures

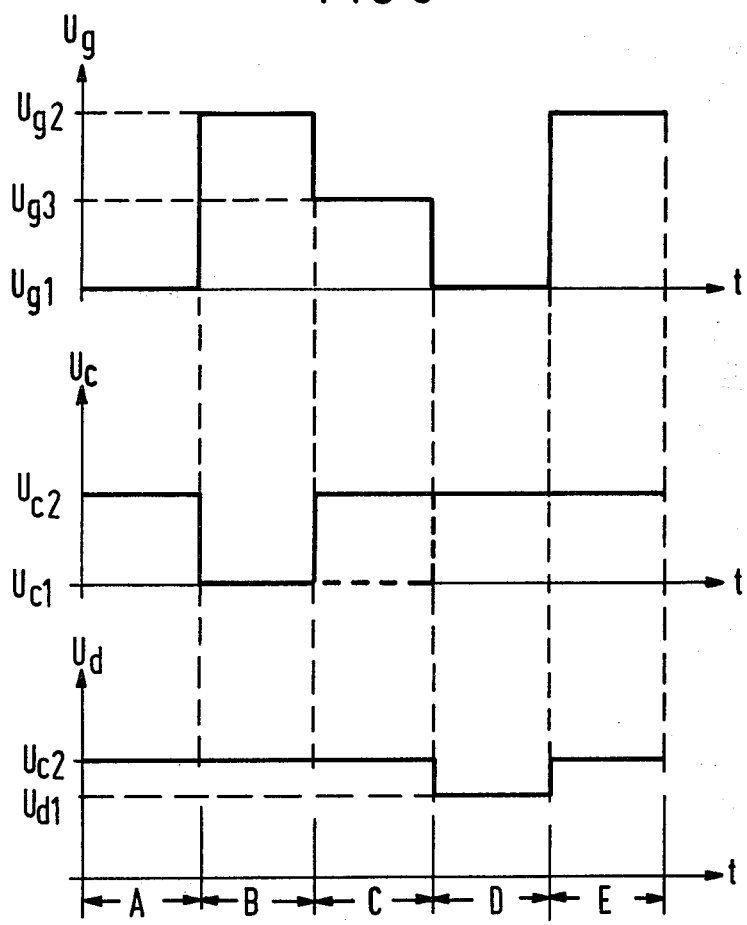

CAPACITOR SEMICONDUCTOR STORAGE CIRCUIT

BACKGROUND OF THE INVENTION

1. Field of the Invention

The present invention relates to a semiconductor storage circuit of the type in which a plurality of storage elements are provided with storage capacitors and are grouped in rows and columns and integrated on a doped semiconductor body, wherein the storage elements which, in each case, form a row are provided with a common first drive line, the storage elements which, in each case, form a column are provided with a common second drive line, the first drive lines are formed from strip-like electrically conductive layers which are separated by an insulating layer from the surface of the semiconductor body, the second drive lines consist of buried lines which extend inside the semiconductor body and are oppositely doped with respect to the semiconductor body, the insulating layer is designed to be thinner inside the intersection zones of the drive lines than outside thereof, and that in these zones insulating capacitors are formed which possess outer electrodes composed of parts of the first drive lines and which represent storage capacitors of the storage elements. More particularly, the width of the buried lines which represent the second drive lines is designed to be less than the dimensions, oriented transversely to these strips, of the aforementioned other electrodes, and that between the buried lines which represent the second drive lines further buried lines are arranged which can be connected by way of terminals to a voltage source.

2. Description of the Prior Art

A storage circuit of the type generally mentioned above is described in detail in the IEEE Journal of Solid-State Circuits, Vol. SC-12, No. 5, October 1977, pp. 534–536. In this storage circuit, the first drive lines are referred to as word lines, the second drive lines are referred to as buried collectors or bit lines, and the insulating layer capacitors are referred to as metal-oxide-semiconductor (MOS) capacitors. The German patent application No. P 27,43948.1 also describes a storage circuit of this type in detail.

When a recorded item of binary information is read from one of the storage elements, the two drive lines assigned to the element are connected to voltages which are such that the minority charge carriers stored in the insulating layer capacitor are injected into the semiconductor body and collected by the second drive line or buried collector. Here, a change occurs in the state of charge of the space charge capacitance of the second drive line which, for this purpose, is released from external potentials, i.e. occupies a "floating" state. While leaving other conditions unchanged, the change in charge leads to a read-out signal on the second drive line which is the greater in magnitude the smaller the quotient of the aforementioned space charge capacitance and the capacitance of the insulating layer capacitor.

SUMMARY OF THE INVENTION

The object of the present invention is to increase the amplitude of the read-out signal in storage circuits of the type generally described above without thereby increasing the diffusion of injected minority charge carriers into adjacent storage elements which are not read simultaneously.

The object is achieved, according to the present invention, in a device of the type generally set forth above, in that the width of the buried lines which represent the second drive lines is designed to be less than the dimensions, oriented transversely to these strips, of the other electrodes, and that between the buried lines which represent the second drive lines there are arranged further buried lines which can be connected by way of terminals to a voltage source.

The advantage which can be achieved by means of the present invention is that, in particular, the minority charge carriers which are injected out of the insulating layer capacitors into the semiconductor body durig reading of information and which are not received by the second drive lines which are reduced in width relative to conventional storage circuits of this type, are collected by the other buried lines and diverted so that they are unable to diffuse towards adjacent storage elements or, during the following recording process, flow back into the storage element from which they have been removed during reading.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a graphic illustration of voltage diagrams for explaining the recording and reading of binary items of information from devices constructed in accordance with the present invention.

DESCRIPTION OF THE PREFERRED EMBODIMENTS

Figure 1:
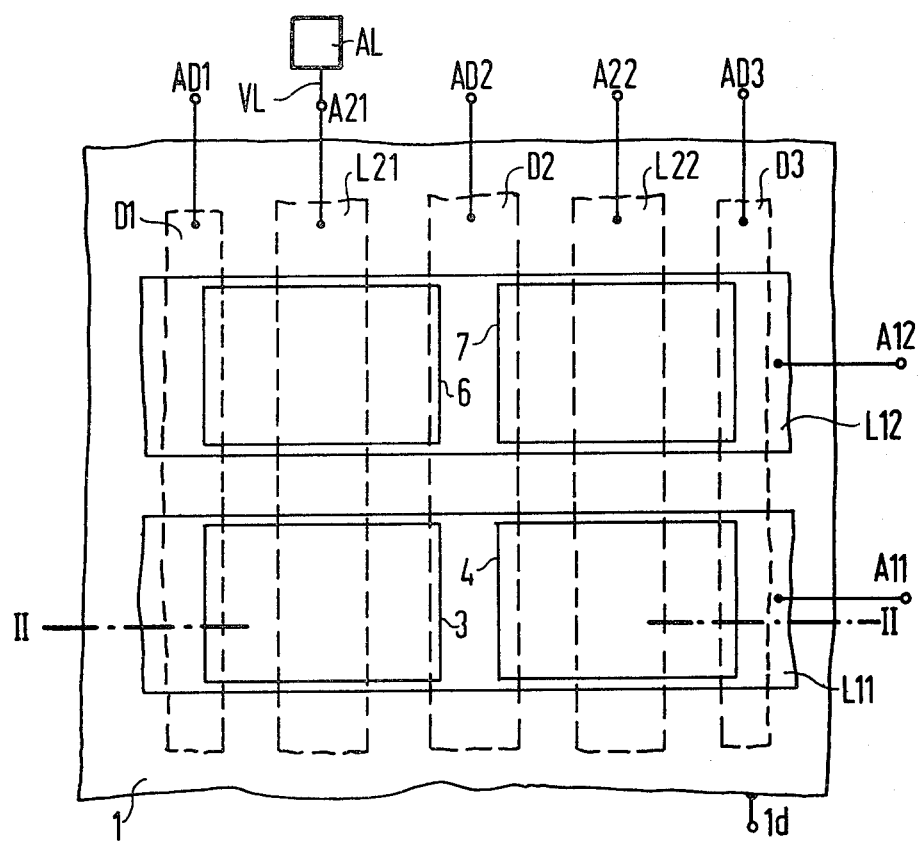
FIG. 1 is a plan view of a semiconductor storage circuit constructed in accordance with the present invention.
Figure 2:
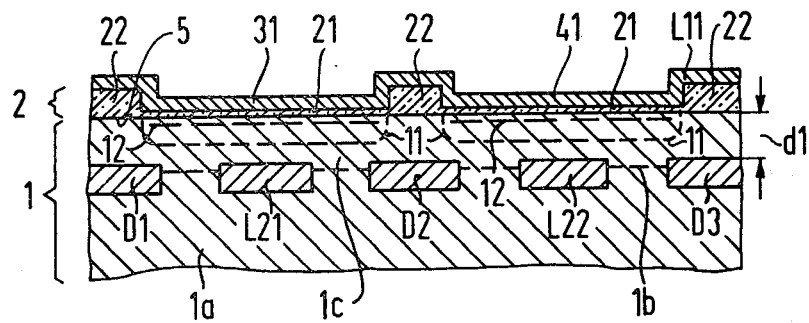
FIG. 2 is a longitudinal section taken along the parting line II—II of FIG. 1.

FIGS. 1 and 2 illustrate a matrix-like assembly of four storage elements which are arranged on the surface of a doped semiconductor body in two rows and two columns. The storage elements arranged in the lower row lie beneath a first drive line L11 which comprises a strip-like, electrically conductive layer, e.g. highly doped, polycrystalline silicon. The drive line L11 is separated by an electrically insulating layer 2, comprising, for example, silicon dioxide ($SiO_2$), from the semiconductor body 1 which comprises, for example p-doped silicon. A terminal A11 is provided for the line L11. Those portions 31 and 41 of the line L11 located within a pair of zones 3 and 4 are considered closer to the upper boundary surface 5 of the semiconductor body 1 than the other sections of the line L11. Those portions 21 of the insulating layer 2 located within these zones are also referred to as thin film zones or gate oxide zones, whereas the other zones 22 are referred to as thick film zones or field oxide zones.

When a sufficiently high positive voltage is connected to the terminal A11, in the semiconductor body 1 which is connected by way of a terminal 1d to a negative substrate bias voltage or to 0 V, beneath the thin film zones 21 space charge zones 11 occur which extend from the boundary surface 5 into the interior of the semiconductor body 1, and also inversion layers 12 are formed by minority charge carriers and are established close to the boundary surface 5 and within the space charge zones 11. The portions 31, 41 of the drive line L11, together with the opposite space charge zones 11 and the inversion layers 12, in each case, form so-called insulating layer capacitors or metal-insulator-semi-conductor (MIS) capacitors—in the case of an insulating oxide layer also referred to as MOS capacitors, which represent the storage capacitors of the individual storage elements.

Therefore, in FIG. 1 beneath the first drive line L11 there are provided two insulating layer capacitors whose lateral boundaries are defined by the zones 3 and 4. These zones simultaneously represent the corresponding boundaries of the storage elements. Similarly, above the upper, first drive line L12 in FIG. 1 there are provided two insulating layer capacitors or storage elements which are laterally bounded by the zones 6 and 7. The line L12 is provided with a terminal A12 as in the lower portion of the figure.

A pair of strips L12 and L22, represented in broken lines in FIG. 1, represent buried layer semiconductor strips which are arranged within the semiconductor body 1 at a distance d1 (FIG. 2) from the boundary surface 5 and are oppositely doped with respect to the semiconductor body. In the case of a p-doped semiconductor body 1, the strips L21 and L22 are therefore n+-doped. The strips provided with terminals A21 and A22 represent common, second drive lines for the storage elements arranged in a column, the line L21 being assigned to the storage elements defined by the zones 3 and 6, and the line L22 being assigned to the storage elements defined by the zones 4 and 7. The storage elements are each arranged within the intersection zones of the first drive lines L11, L12 and the second drive lines L21, L22.

In accordance with FIG. 2, the width of each of the drive lines L21 and L22 is considerably less than the width, measured in the same direction, of the components 31, 41 and the corresponding widths of the individual storage cells. As a result, the quotient formed from the capacitance of a storage capacitor and the portion of the blocking layer capacitance of the drive line L21 which falls to a storage element is likewise considerably reduced. Between the second drive lines L21, L22 there are provided further buried lines D1–D3 which have terminals AD1–AD3, respectively, which can also be connected to one another.

In the following, the recording and reading of items of binary information into and out of a storage element, e.g. the element arranged in the zone 3, will be described in detail. Here, the associated first drive line L11 will be considered to be a word line, the second drive line L21 will be considered to be a bit line, and the other buried lines D1–D3 will be referred to as drain lines. For this purpose, FIG. 3 illustrates detailed voltage-time diagrams of the voltage $U_g$ with respect to time t which is supplied to the word line L11, the voltage $U_c$ with respect to time which is supplied to the bit line L21, and the voltage $U_d$ with respect to time which is supplied to the drain lines D1–D3.

Prior to the recording of items of information, as a result of the connection of a low voltage $U_{g1}$ to the word line and a high voltage $U_{c2}$ to the bit lines and to the drain lines, the minority charge carriers stored in the individual storage elements are injected into the substrate 1, most of them collected by the bit lines and the rest are collected by the drain lines and diverted via the latter. In FIG. 3, the time interval A has been assigned to this process. The following time interval B explains the recording of a first item of binary information into the storage element in question, which information is defined by the presence of an inversion layer 12. For this purpose, the voltage $U_g$ is brought to a high value $U_{g2}$, whereas the voltage $U_c$ is brought to a low value $U_{c1}$. A space charge zone 11 which extends within the zone 3 from the boundary surface 5 to the bit line L21 is therefore formed. Within this space charge zone charge carriers emerge from the bit line and move in the direction towards the boundary surface 5, whereby an inversion layer 12 is formed. The drain lines continue to be supplied with the voltage $U_{c2}$ in order to prevent the space charge zone 11 from reaching the drain lines D1 and D2. In order to store the recorded information (section C) it is sufficient to reduce the voltage $U_g$ to a mean value $U_{g3}$, where the voltage $U_c$ may assume values between $U_{c1}$ and $U_{c2}$ and the voltage $U_d$ advantageously has the value $U_{c2}$.

The reading of the stored information takes place in the time section D in which the voltages $U_{g1}$ and $U_{c2}$ are connected and the drain lines D1–D3 are supplied with a voltage $U_{d1}$ which is lower than the voltage $U_{c2}$. This ensures that during reading the number of charge carriers which emanate from the inversion layer 12 and diffused towards the drain lines D1 and D2 and are therefore lost in respect of the bit line L21, is maintained as small as possible. Those charge carriers which nevertheless diffuse towards the drain lines D1 and D2 are collected in the latter and shunted so that they are unable to diffuse into adjacent storage elements where they could adulterate other items of information, and they are also unable, during the following recording process of an item of binary information into the storage element in question to flow back into the storage element, whereby adulteration of the information could likewise occur.

The time section E explains the recording of a second item of binary information which is characterized by the absence of an inversion layer 12. For this purpose, voltages $U_{g2}$ and $U_{c2}$ are connected to the lines L11 and L21, whereby a space charge zone 11 extending from the boundary surface 5 and a spaced charge zone leading from the bit line L21 are formed. However, a potential threshold exists between these zones so that virtually no charge carriers can pass from the line L21 to the boundary surface 5. Therefore, no inversion layer 12 is formed. Here, the drain lines D1–D3 are connected to the voltage $U_{c2}$ in order to prevent charge carriers passing from the lines D1 and D2 into the storage capacitor of the zone 3. The read-out of the stored second item of binary information again takes place in accordance with the time section D.

To enter into details, the read-out takes place in that the bit-line L21 which was initially connected to the voltage $U_{c2}$ is set to the potential corresponding to the voltage $U_{c2}$ and is then freed of external voltages so that it occupies a floating potential state. If injected charge carriers are now intercepted by the bit line L21, a change occurs in its state of charge. In a following read-out arrangement AL, a connection line VL connected, for example, to the terminal A21, is then connected to a gate of a MOS FET amplifier which derives a read-out voltage signal from the potential change which occurs on the line L21.

When the semiconductor body 1 is provided with a p-doping of approximately $10^{15}$ and the strips L21, L22, D1, D2 and D3 are provided with a $n^+$-doping of approximately $5\cdot 10^{19}$, when $d1 = 3$ μm, it is advantageous to fix the voltage values $U_{g1}$ and $U_{c1}$ to approximately 0 V, the voltage $U_{g2}$ at approximately 12 V, the voltage $U_{g3}$ at approximately 5 V and the voltage $U_{c2}$ at approximately 5 V, whereas the voltage $U_{d1}$ can be in the range from 0 to 2 V. Here, the semiconductor body 1 carries either a negative substrate bias voltage or a 0 V.

The production of the semiconductor storage circuit corresponding to the present invention is advantageously based on a doped semiconductor substrate 1a into which the dopants for the buried strips L21, L22 and D1–D3 are diffused from the surface 1b. Then, an epitaxial layer 1c is grown which possesses the same doping as the substrate 1a.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A semiconductor storage circuit comprising:
   a doped semiconductor body comprising a plurality of storage cells arranged in columns and rows, each of said cells including a storage capacitor;
   for each row, a common first drive line, and, for each column, a common second drive line;
   an insulating layer carried on said semiconductor body;
   each of said first drive lines comprising a strip-like electrically conductive layer carried on said insulating layer;
   each of said second drive lines comprising buried lines extending within said semiconductor body and doped opposite thereto;
   said drive lines extending in different directions so as to intersect each other and define intersection zones;
   said insulating layer including first portions within said intersection zones which are thinner than the remainder of said insulating layer so that in said intersection zones insulating layer capacitors are formed which possess outer electrodes composed of portions of said first drive lines and constitute said storage capacitors of said storage elements;
   the width of said buried second drive lines being less than the dimensions, oriented transversely to said second drive lines, of said outer electrodes; and
   further buried lines in said semiconductor body spaced apart and interposed between said second drive lines and adapted for connection to a voltage source.

2. The semiconductor storage circuit of claim 1, wherein:
   said semiconductor body comprises a doped semiconductor substrate including a surface portion containing said buried lines and said further buried lines; and
   a doped epitaxial layer carried on said surface portion and having the same conductivity as said substrate.

3. A process for operating a semiconductor storage circuit of the type in which a plurality of storage elements, which are provided with storage capacitors and grouped in rows and columns are integrated on a doped semiconductor body, in which the storage elements which form a row are provided with a respective common first drive line, in which the storage elements which form a column are provided with a respective common second drive line, in which the first drive lines are formed from strip-like electrically conductive layers which are separated from the surface of the semiconductor body by an insulating layer, in which the second drive lines comprise buried lines which extend within the semiconductor body and are oppositely doped with respect thereto, in which the first and second drive lines extend in different directions so as to intersect one another and define intersection zones, in which the insulating layer is thinner within the intersection zones than outside thereof so that within such zones insulating layer capacitors are formed which possess outer electrodes composed of parts of the first drive lines and which constitute the storage capacitors of the storage elements, in which the width of the buried lines is less than the dimensions, oriented transversely of such lines, of the outer electrodes, and in which further buried lines are arranged between the first-mentioned buried lines and adapted for connection to a voltage source, said process comprising the steps of:
   for recording a first item of binary information into a storage element, applying a first upper voltage value to a first drive line assigned to that storage element and applying a second lower voltage value to the associated second drive line;
   in order to write a second item of binary information, applying first upper voltage value to the first drive line and applying a second upper voltage value to the second drive line;
   in order that the recorded item of information may be stored, applying a mean voltage value to the first drive line;
   in order that the stored information may be read, applying a first low voltage value to the first drive line after first applying the second upper voltage value to the second drive line so that the change in charge which occurs on the second drive line as a result of injected charge carriers may be output to a reading arrangement; and
   in the event of recording of the first binary information, applying a higher voltage then applied to the second drive lines to the further buried lines, and in the event of reading the first binary information, applying a lower voltage than applied to the second drive lines to the further buried lines.

4. The process of claim 3, comprising the further step of:
   in recording a second item of binary information, applying the same voltages to the second drive line and the further buried lines.

* * * * *